United States Patent
Berggren (10) Patent No.: US 9,894,625 B2
(45) Date of Patent: *Feb. 13, 2018

(54) FACILITATING SYNCHRONIZATION BETWEEN A BASE STATION AND A USER EQUIPMENT

(71) Applicant: Huawei Technologies Co., Ltd., Shenzhen (CN)

(72) Inventor: Fredrik Berggren, Kista (SE)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 14/576,797

(22) Filed: Dec. 19, 2014

(65) Prior Publication Data

US 2015/0103810 A1 Apr. 16, 2015

Related U.S. Application Data

(63) Continuation of application No. 14/138,031, filed on Dec. 21, 2013, now Pat. No. 8,995,419, which is a
(Continued)

(51) Int. Cl.
*H04W 56/00* (2009.01)
*H04W 76/00* (2009.01)
(Continued)

(52) U.S. Cl.
CPC ......... *H04W 56/001* (2013.01); *H03M 13/33* (2013.01); *H04B 1/7083* (2013.01);
(Continued)

(58) Field of Classification Search
CPC ... H04W 56/00; H04W 56/001; H04W 72/02; H04W 72/0466; H04L 7/041;
(Continued)

(56) References Cited

U.S. PATENT DOCUMENTS 6,356,555 B1* 3/2002 Rakib ................ H03M 13/256
348/E7.07
6,504,830 B1 1/2003 Ostberg et al.
(Continued)

FOREIGN PATENT DOCUMENTS

CN 1395387 A 2/2003
CN 1395772 A 2/2003
(Continued)

OTHER PUBLICATIONS

3rd Generation Partnership Project; Technical Specification Group Radio Access Network; Spreading and modulation (FDD) (Release 6), 3GPP TS 25.213, V6.4.0, Sep. 2005, 32 pages.
ETRI, "Cell Search Scheme for EUTRA," 3GPP RAN WG1 #44 bis Meeting, R1-060823, Athens, Greece, Mar. 27-31, 2006, 14 pages.
Huawei, "Cell search times of hierarchical and non-hierarchical SCH signals," 3GPP TSG RAN WG1#45, R1-061248, Shanghai, China, May 8-12, 2006, 4 pages.
(Continued)

*Primary Examiner* — Ahmed Elallam
(74) *Attorney, Agent, or Firm* — Slater Matsil, LLP (57) ABSTRACT

Methods and apparatus are provided for facilitating synchronization between a base station (BS) and a user equipment (UE) in a mobile communication system. The UE receives a synchronization signal originated by the BS. The synchronization signal is encoded with a selected cyclically permutable (CP) codeword. Encoding of the synchronization signal is facilitated by a repetitive cyclically permutable (RCP) codeword derivable from the selected CP codeword. The RCP codeword has a plurality of codeword elements each associated with a value, the value of at least one codeword element in the RCP codeword being repeated in another codeword element position in the RCP codeword. And the synchronization signal is decoded in accordance with repetitive structure of the RCP codeword.

27 Claims, 2 Drawing Sheets

Related U.S. Application Data continuation of application No. 13/863,203, filed on Apr. 15, 2013, now Pat. No. 8,718,034, which is a continuation of application No. 12/342,461, filed on Dec. 23, 2008, now Pat. No. 8,422,476, which is a continuation of application No. PCT/CN2006/002526, filed on Sep. 25, 2006.

(51) Int. Cl.

| | | |
|---|---|---|
| *H03M 13/33* | (2006.01) | |
| *H04B 1/7083* | (2011.01) | |
| *H04J 13/00* | (2011.01) | |
| *H04L 7/04* | (2006.01) | |
| *H04W 88/04* | (2009.01) | |
| *H04W 88/08* | (2009.01) | |

(52) U.S. Cl.
CPC .............. *H04J 13/00* (2013.01); *H04L 7/041* (2013.01); *H04W 56/00* (2013.01); *H04W 88/04* (2013.01); *H04W 88/08* (2013.01)

(58) Field of Classification Search
CPC .............. H04L 27/2655; H04L 27/2656; H04L 27/2657; H04B 1/7073; H04B 1/7083; H04B 1/7156; H04B 7/2662; H04B 7/2681; H04B 7/0456; H04J 13/00; H04J 13/18; H04J 2013/165; H04J 11/0069; H04J 11/0073; H04J 13/10; H04J 13/16; H04J 11/0076; H04J 3/06; H04J 3/0602; H04J 3/0605; H04J 13/0007; H03M 13/33; H03M 13/333
See application file for complete search history.

(56) References Cited

U.S. PATENT DOCUMENTS

| | | | |
|---|---|---|---|
| 6,526,091 B1 | 2/2003 | Nystrom et al. | |
| 6,571,099 B1 | 5/2003 | Kim et al. | |
| 6,603,735 B1 | 8/2003 | Park et al. | |
| 6,717,930 B1 | 4/2004 | Sezgin et al. | |
| 6,728,229 B1 | 4/2004 | Lim | |
| 6,731,673 B1 | 5/2004 | Kotov et al. | |
| 6,754,251 B1 | 6/2004 | Sriram et al. | |
| 6,760,361 B2 | 7/2004 | Nystrom et al. | |
| 6,891,882 B1 | 5/2005 | Hosur et al. | |
| 7,106,690 B2* | 9/2006 | Song | H04J 13/10 370/208 |
| 7,110,782 B2* | 9/2006 | Yamaguchi | H04B 1/70735 370/324 |
| 7,126,981 B2 | 10/2006 | Ho et al. | |
| 7,236,468 B2 | 6/2007 | Ryu et al. | |
| 7,268,709 B2 | 9/2007 | Park et al. | |
| 7,272,376 B1* | 9/2007 | Sparr | H04B 1/7083 370/335 |
| 7,283,069 B2 | 10/2007 | Shaver et al. | |
| 7,289,483 B1* | 10/2007 | Lim | H04B 1/7083 370/342 |
| 7,369,531 B2* | 5/2008 | Cho | H04J 13/10 370/208 |
| 7,369,577 B2 | 5/2008 | Darbel et al. | |
| 7,386,055 B2* | 6/2008 | Morita | H04B 1/70735 375/260 |
| 7,430,196 B2 | 9/2008 | Turunen | |
| 7,487,355 B2 | 2/2009 | Pelly et al. | |
| 7,580,400 B2* | 8/2009 | Sung | H04J 11/0069 370/203 |
| 7,583,586 B2* | 9/2009 | Park | H04L 5/0048 370/209 |
| 7,633,976 B2 | 12/2009 | Shieh et al. | |
| 7,664,090 B2* | 2/2010 | Anderson | H04J 13/16 370/320 |
| 7,668,224 B2 | 2/2010 | Hocevar et al. | |
| 7,848,438 B2 | 12/2010 | Baum et al. | |
| 7,911,935 B2* | 3/2011 | Akita | H04L 5/0007 370/208 |
| 7,965,761 B2 | 6/2011 | Shattil | |
| 8,004,959 B2* | 8/2011 | Dent | H04J 13/105 370/209 |
| 8,134,996 B2* | 3/2012 | Onggosanusi | H04J 11/0069 370/350 |
| 8,223,625 B2* | 7/2012 | Malladi | H04J 11/0069 370/208 |
| 8,284,757 B2 | 10/2012 | Berggren | |
| 8,385,318 B2* | 2/2013 | Tanno | H04B 1/7075 370/350 |
| 8,422,476 B2 | 4/2013 | Berggren | |
| 8,718,034 B2 | 5/2014 | Berggren | |
| 2003/0007476 A1 | 1/2003 | Kim et al. | |
| 2003/0128657 A1 | 7/2003 | Kuroyanagi et al. | |
| 2003/0169702 A1 | 9/2003 | Ryu et al. | |
| 2004/0160934 A1 | 8/2004 | Back | |
| 2004/0161020 A1 | 8/2004 | Mathew et al. | |
| 2005/0111522 A1 | 5/2005 | Sung et al. | |
| 2005/0153695 A1 | 7/2005 | Cho | |
| 2006/0028976 A1 | 2/2006 | Park et al. | |
| 2006/0120482 A1 | 6/2006 | Park et al. | |
| 2006/0188009 A1 | 8/2006 | Litwin et al. | |
| 2008/0043702 A1* | 2/2008 | Moon | H04J 11/0069 370/342 |
| 2009/0323629 A1 | 12/2009 | Undoff et al. | |

FOREIGN PATENT DOCUMENTS

| | | |
|---|---|---|
| CN | 101573899 B | 1/2013 |
| WO | 0065736 A1 | 11/2000 |
| WO | 2006000091 A1 | 1/2006 |
| WO | 2007082408 A1 | 7/2007 |

OTHER PUBLICATIONS

Huawei, "Additional link-level evalation of cell search times for non-hierarchical and hierarchical SCH signals," 3GPP TSG RAN WG1 LTE AdHoc, R1-061817, Cannes, France, Jun. 27-30, 2006, 6 pages.

Huawei, "System-level evaluation of cell search times for non-hierarchical and hierarchical SCH signals," TSG RAN WG1 ad hoc meeting, R1-061818, Jun. 27-30, 2006, 6 pages.

Schmidl, T. et al., "Robust Frequency and Timing Synchronization for OFDM," IEEE Transactionson Communications, vol. 45, No. 12, Dec. 1997, 9 pages.

Sriram, S. et al., "Cyclically Permutable Codes for Rapid Acquisition in DS-CDMA Systems with Asynchronous Base Stations," IEEE Journal on Selected Areas in Communications, vol. 19, No. 1, Jan. 2001, 12 pages.

Tanda, "Blind Symbol-Timing and Frequency-Offset Estimation in OFDM System With Real Data Symbols," IEEE Transactions on Communication, vol. 52, No. 10, Oct. 2004, 4 pages.

Wang, Y. et al., "Cell Search in W-CDMA," IEEE Journal on Selected Areas in Communications, vol. 18, No. 8, Aug. 2000, 13 pages.

Chunghwa Telecom Laboratories, "Aspects of Cell Search for E-UTRA Downlink", 3GPP TSG RAN WG1 Meeting#45, R1-061145, May 8-12, 2006, 5 pages, Shangai, China.

Texas Instruments, "Hierarchical and Non-Hierarchical Cell Search Replica Based, 2x Differential, and Reverse Differential Timing Detection", 3GPP TSG RAN WG1 LTE AdHoc, R1-061745, Jun. 27-30, 2006, 8 pages, Cannes, France.

LG Electronics, "Performance Comparison of Hierarchical and Non-Hierarchical SCH Structures", 3GPP TSG RAN WG1 LTE AdHoc, R1-061752, Jun. 27-30, 2006, 10 pages, Cannes, France.

LG Electronics, "S-SCH Sequence Design", 3GPP TSG RAN WG1 #47 bis, R1-070231, Jan. 15-19, 2007, 10 pages, Sorrento, Italy.

* cited by examiner

FACILITATING SYNCHRONIZATION BETWEEN A BASE STATION AND A USER EQUIPMENT

This application is a continuation of U.S. patent application Ser. No. 14/138,031, filed on Dec. 21, 2013, which is a continuation of U.S. patent application Ser. No. 13/863,203, filed on Apr. 15, 2013, now U.S. Pat. No. 8,718,034, issued on May 6, 2014, which is a continuation of U.S. patent application Ser. No. 12/342,461, filed on Dec. 23, 2008, now U.S. Pat. No. 8,422,476, issued on Apr. 16, 2013, which is a continuation of International Patent Application No. PCT/CN2006/002526, filed on Sep. 25, 2006. The patent applications identified above are incorporated herein by reference in their entireties to provide continuity of disclosure.

TECHNICAL FIELD

The present application relates to synchronization technology between a base station and a user equipment in a mobile communications system.

BACKGROUND

In a mobile communications system, cell search is a procedure by which a user equipment (UE) acquires time and frequency synchronization in a cell and detects a cell ID. The UE is time synchronized when start of symbols as well as a radio frame is found. Both symbol timing and frame timing need to be found for completing a cell search.

To improve the symbol timing performance, the synchronization signals are envisaged to be multiplexed several times in a radio frame. Thereby output statistics from a correlator performing symbol timing acquisition can be accumulated, and the probability of correct symbol timing is improved. Furthermore, to allow efficient handover between different radio systems, it is anticipated that synchronization signals are multiplexed several times in a radio frame. However, a consequence of such multiplexing is that frame timing may not follow directly from symbol timing. Mechanisms are therefore needed that, given symbol timing, frame timing can be determined.

Two classes of synchronization channel (SCH) to be used in cell search can be defined: a non-hierarchical SCH and a hierarchical SCH. A non-hierarchical SCH includes cell-specific signals that serve for timing acquisition, frequency acquisition, and cell ID detection. A hierarchical SCH includes at least two signals; a known primary cell-common signal used only for symbol timing acquisition, and a cell-specific signal used for frame timing synchronization, frequency synchronization, and cell ID detection.

Refer to a list of reference documents at the end of this specification, a previously used concept, shown in reference documents [1], [2] and [3], comprises transmission of different signals in SCH slots within a frame, wherein the reference documents are listed at the end of the document. Given symbol timing, signals in the SCH slots are detected independently, but together they represent elements of a codeword from a synchronization code. Since SCH is periodically transmitted, the receiver can detect any cyclic version of a codeword. The synchronization code is therefore constructed such that all cyclic shifts of a codeword are unique and no codeword is a cyclic shift of another codeword. Thereby frame timing can be uniquely determined from a cyclic shift of the detected codeword.

In a fully non-hierarchical SCH, it is foreseen that both cell ID and frame synchronization are detected only from SCH signals within a frame, i.e. no hierarchical cell ID grouping or other channels should be needed. Correspondingly, in a non-hierarchical solution, a user equipment (UE) would need to decode and compute metrics for 512 codewords (cell IDs) and their cyclic shifts at once. Since cell ID detection is done both initially for finding a home cell and continuously for supporting mobility by finding neighbor cells, such an exhaustive procedure may become overly tedious, and consume a lot of computing and power resources in the UE and prolong the cell search time. Moreover, as has been discussed for a E-UTRA system, not only cell IDs but also additional cell-specific information may be included in the cell search procedure, e.g. channel bandwidth, number of antennas, cyclic prefix lengths etc. This would require even larger sets of codewords that need to be efficiently decoded.

It is desirable to give codewords some form of structure that can be utilized by the receiver.

SUMMARY

It is an object of the present invention to facilitate synchronization between a base station and a user equipment in a mobile communication system.

The foregoing and other objects are achieved by the features of the independent claims. Further implementation forms are apparent from the dependent claims, the description and the figures.

According to a first aspect, a method is provided for facilitating synchronization between a base station (BS) and a user equipment (UE) in a mobile communication system. A set of cyclically permutable (CP) codewords is defined, a plurality of cyclic shifts being derivable from each CP codeword, each cyclic shift being distinct from any other cyclic shift derivable from the set of CP codewords. The BS selects a CP codeword from the set and encodes the selected CP codeword into a synchronization signal to be sent to the UE. The encoding is facilitated by a repetitive cyclically permutable (RCP) codeword derivable from the selected CP codeword. A plurality of cyclic shifts is derivable from the RCP codeword. Each cyclic shift derivable from the RCP codeword is distinct from any other cyclic shift derivable from the RCP codeword. The RCP codeword has a plurality of codeword elements each associated with a value. The value of at least one codeword element in the RCP codeword is repeated in another codeword element position in the RCP codeword. The synchronization signal comprises a plurality of synchronization sequences being transmitted in a radio frame.

According to a second aspect, a base station is provided. The base station includes at least one processor configured to define a set of cyclically permutable (CP) codewords, a plurality of cyclic shifts being derivable from each CP codeword. Each cyclic shift is distinct from any other cyclic shift derivable from the set of CP codewords. The processor is also configured to select a CP codeword from the set and encode the selected CP codeword into a synchronization signal to be sent to an user equipment (UE). The encoding is facilitated by a repetitive cyclically permutable (RCP) codeword derivable from the selected CP codeword. A plurality of cyclic shifts is derivable from the RCP codeword. Each cyclic shift is derivable from the RCP codeword is distinct from any other cyclic shift derivable from the RCP codeword. The RCP codeword has a plurality of codeword elements each associated with a value. The value of at least one codeword element in the RCP codeword is repeated in another codeword element position in the RCP codeword.

The synchronization signal comprises a plurality of synchronization sequences being transmitted in a radio frame.

According to a third aspect, a method is provided for facilitating synchronization between a BS and a UE in a mobile communication system. The UE receives a synchronization signal originated by the BS. The synchronization signal is encoded with a selected cyclically permutable (CP) codeword, the selected CP codeword being selected from a set of CP codewords. A plurality of cyclic shifts is derivable from each CP codeword. Each cyclic shift is distinct from any other cyclic shift derivable from the set of CP codewords. The encoding of the synchronization signal is facilitated by a repetitive cyclically permutable (RCP) codeword derivable from the selected CP codeword. A plurality of cyclic shifts is derivable from the RCP codeword. Each cyclic shift derivable from the RCP codeword is distinct from any other cyclic shift derivable from the RCP codeword. The RCP codeword has a plurality of codeword elements each associated with a value. The value of at least one codeword element in the RCP codeword is repeated in another codeword element position in the RCP codeword. The UE decodes the synchronization signal in accordance with repetitive structure of the RCP codeword. The synchronization signal comprises a plurality of synchronization sequences being transmitted in a radio frame.

According to a fourth aspect, a UE is provided. The UE includes at least one processor configured to receive a synchronization signal originated by a base station, the synchronization signal being encoded with a selected cyclically permutable (CP) codeword. The selected CP codeword is selected from a set of CP codewords. A plurality of cyclic shifts is derivable from each CP codeword. Each cyclic shift is distinct from any other cyclic shift derivable from the set of CP codewords, the encoding of the synchronization signal being facilitated by a repetitive cyclically permutable (RCP) codeword derivable from the selected CP codeword. A plurality of cyclic shifts is derivable from the RCP codeword. Each cyclic shift is derivable from the RCP codeword being distinct from any other cyclic shift derivable from the RCP codeword. The RCP codeword has a plurality of codeword elements each associated with a value. The value of at least one codeword element in the RCP codeword is repeated in another codeword element position in the RCP codeword.

The at least one processor is also configured to decode the synchronization signal in accordance with repetitive structure of the RCP codeword. The synchronization signal comprises a plurality of synchronization sequences being transmitted in a radio frame.

According a fifth aspect, a mobile communication system is provided. The system includes a BS operable to communicate with a UE. The BS includes at least one processor configured to define a set of cyclically permutable (CP) codewords. A plurality of cyclic shifts is derivable from each CP codeword. Each cyclic shift being distinct from any other cyclic shift derivable from the set of CP codewords. The at least one processor is also configured to select a CP codeword from the set and encode the selected CP codeword into a synchronization signal to be sent to the UE. The encoding is facilitated by a repetitive cyclically permutable (RCP) codeword derivable from the selected CP codeword. A plurality of cyclic shifts is derivable from the RCP codeword. Each cyclic shift is derivable from the RCP codeword being distinct from any other cyclic shift derivable from the RCP codeword. The RCP codeword has a plurality of codeword elements each associated with a value. The value of at least one codeword element in the RCP codeword is repeated in another codeword element position in the RCP codeword. The synchronization signal comprises a plurality of synchronization sequences being transmitted in a radio frame.

The invention thus presents a solution that gives a performance close to pure maximum likelihood detection, which is an optimal detection, but with much lower decoding complexity due to the repetitive structure design.

These and other aspects of the invention will be apparent from the embodiments described below.

DETAILED DESCRIPTION OF ILLUSTRATIVE EMBODIMENTS

In cell search, the first step is the symbol synchronization. The symbol timing in the non-hierarchical SCH is typically obtained by auto-correlation methods of the received signal, taking certain properties of the synchronization signal into account. Both symmetric and periodic signals have been suggested in the background art, see reference documents [4] and [5] for symmetric signals and reference document [6] for periodic signals. In a hierarchical method, the symbol timing can be obtained by correlation with a replica of the transmitted primary synchronization channel (P-SCH). Usually there is also some form of frequency synchronization. Once symbol timing and frequency synchronization is found, frame timing synchronization and cell ID detection may begin. Symbol- and frequency-synchronization are outside the scope of this invention and are assumed to be performed in the system.

In WCDMA, the secondary SCH (S-SCH), is transmitted in 15 slots per radio frame. In each such slot, 1 out of 16 S-SCH sequences can be used. These 15 slots are interpreted as the elements of a code word with the S-SCH sequence allocations taken from a Reed-Solomon code. In total there are 64 used S-SCH codewords of length 15. These codewords and all their cyclic shifts are designed to be unique, i.e. it is a comma-free code. For decoding a codeword, the receiver computes a soft decoding metric for all codewords and all their cyclic shifts, i.e. in total 64*15 metrics, as is shown in reference document [3]. Thereby, frame timing is directly obtained once the S-SCH is correctly decoded. The codewords also correspond to the scrambling code groups. Finally, the cell ID is determined from exhaustive test of all scrambling codes in the detected scrambling code group, using the common pilot channel (CPICH).

In reference document [7], the comma-free code concept has been adopted to non-hierarchical SCH. Different periodic signals, which are used both for finding symbol timing and cell ID, are transmitted in 5 slots within the radio frame. Albeit the signals may be different, they all have the same time-domain property (periodicity). Hence, different periodic signals may be multiplexed into the radio frame without loss of averaging gain for the symbol timing. The same conclusion also holds if the synchronization signals are symmetric. A code is given that comprises 236 codewords, requiring 236*5 metric computations for decoding. As for the hierarchical scheme, the correct decoding of a codeword gives the cell ID and the frame timing. Another code, found by exhaustive search to give 512 codewords of length 4, is used in the non-hierarchical scheme shown in reference document [8]. The decoding is here done by the maximum likelihood principle.

Thus the above described background art solutions all rely on the maximum likelihood soft decoding principle, not using any particular structure of the code as basis for decoding.

The present invention aims to present a synchronization code and associated method for detecting frame timing synchronization and cell-specific information. The synchronization signal comprises M SCH sequences/symbols being transmitted per radio frame. The allocation of SCH sequences to the M slots is performed in accordance with the code of the present invention, which has a repetitive structure that provides means for efficient decoding.

For M SCH symbols per radio frame and N different possible SCH sequences/symbols, a repetitive cyclically permutable code construction is, according to the invention, proposed to have the following characteristics:

The code should be a cyclically permutable code of length M from an alphabet N such that no codeword is a cyclic shift of another and each codeword has M distinct cyclic shifts. Codes like this are known from, for instance, reference document [3].

The code should further have a repetitive structure so that at least one codeword element appears at least two times within the same codeword. This repetitive structure must be followed in each codeword of the code. This is a new feature, proposed by the present invention.

By adding the proposed repetitive structure to the codewords, a decoding method can be deduced for which a low number of decoding metrics need to be computed for detection of the frame synchronization.

The repetitive structure of the codewords gives means for diversity combining and the associated decoding method utilizes the repetitive structure in the code to obtain frame synchronization and cell ID. The decoding method according to the invention has the following characteristics.

For each of the M SCH slots in the frame, a metric is computed for each of the N SCH sequences (e.g. obtained from correlation with all candidate sequences) which relates to the probability that the sequence was transmitted. This is also done in background art decoding methods.

A set of hypotheses is tested, exploiting the computed metrics and the repetitive structure of the codewords, and one hypothesis that best fits the structure of the codeword is selected. This selected hypothesis determines which of the M received codeword elements that can be diversity combined. This part of the decoding method, proposed by the present invention, is new compared to background art decoding methods.

Diversity combining (summation) of the repeated symbols' metrics is performed, using information relating to the selected hypothesis. This is also a new feature.

Cell ID and final frame synchronization are found from codewords, detected by selecting, for each slot, the sequence with the largest diversity combined metric. This is also a new feature.

It will later in this specification be shown, for an exemplary embodiment of the invention, that this decoding method can, compared to maximum likelihood decoding, reduce the decoding complexity a factor MW/N for even M, and a factor 2W/N for odd M, where M is the codeword length, N is the number of candidate SCH sequences/symbols and W is the number of codewords.

For a given M and N, the decoding complexity and detection performance of the method according to the invention are, for the method steps of hypothesis testing, diversity combining and codeword detection, independent of the number of codewords in the code. This is in contrast to a maximum likelihood decoder, for which the decoding complexity grows with the number of codewords and, at the same time, the decoding performance gets worse.

In the following a more detailed description of the present invention is given. It is first showed a couple of exemplary embodiments of how the code is created by describing how the codewords are generated and thereafter is the decoding procedure described.

Code construction will now be discussed.

The type of code presented in reference document [3] can be used as a starting point when generating a code according to the present invention. In reference document [3], a cyclically permutable code of length M was defined as having the property that no code word is a cyclic shift of another, and each codeword has M distinct cyclic shifts. Such a code can uniquely encode frame timing, since all codewords and all cyclic shifts of the codewords are unique, and is thus very suitable to use for synchronization.

Now assume that $$\left(c_1, c_2, \ldots, c_{\lceil \frac{M}{2} \rceil}\right)$$

is a codeword from a cyclically permutable code, such as the code in reference document [3] or any other suitable code, of length $$\left\lceil \frac{M}{2} \right\rceil,$$

where $$\left\lceil \frac{M}{2} \right\rceil$$

is the smallest integer not less than M/2. Suppose $1 \leq c_i \leq N$ for all i, N is thus the alphabet (the number of possible SCH sequences/symbols) that can be used in each element of the codewords.

A first repetitive cyclically permutable (RCP) code $(\tilde{c}_1, \tilde{c}_2, \ldots, \tilde{c}_M)$ according to the invention can then be constructed by:

for M even:
$$\tilde{c}_{2k-1} = \tilde{c}_{2k} = c_k, k = 1, 2, \ldots, M/2,$$
$$\tilde{c}_{2k-1} = \tilde{c}_{2k} = c_k, k = 1, 2, \ldots, \left\lceil \frac{M}{2} \right\rceil - 1,$$
and for M odd: $\tilde{c}_M = c_{\lceil \frac{M}{2} \rceil}.$ We have here created a repetitive cyclically permutable code. To prove that the created repetitive code really is cyclically permutable, and thus fulfils the basic requirement for application to frame timing detection, we will now show that the codewords $(\tilde{c}_1,\tilde{c}_2, \ldots, \tilde{c}_M)$ constitute a cyclically permutable code in the following proof.

Start of Proof.

First, let M be even and consider a codeword $$(\tilde{c}_1, \tilde{c}_2, \ldots, \tilde{c}_M) = \left(c_1, c_1, c_2, c_2, \ldots, c_{\frac{M}{2}}, c_{\frac{M}{2}}\right).$$

For the one-step cyclically shifted codeword $$\left(c_{\frac{M}{2}}, c_1, c_1, c_2, \ldots, c_{\frac{M}{2}}\right)$$

to be equal to the non-shifted codeword, we must have $$c_1 = c_2 = \ldots = c_{\frac{M}{2}},$$

which is impossible, since the M/2 symbols long codeword $$\left(c_1, c_2, \ldots, c_{\frac{M}{2}}\right)$$

is cyclically permutable by assumption. Proceeding in the same manner, for every cyclic shift, the same criteria follows $$c_1 = c_2 = \ldots = c_{\frac{M}{2}}.$$

It is straightforward to see that the same condition appears when M is odd. Hence the codeword $(\tilde{c}_1,\tilde{c}_2, \ldots, \tilde{c}_M)$ has M distinct shifts.

Since all the original M/2 symbols long codewords are unique by assumption, and the mapping to the M symbols long codewords is one-to-one, the codewords must also be unique. Therefore, each codeword is unique and has M distinct shifts.

Consider further another codeword $$(\tilde{b}_1, \tilde{b}_2, \ldots, \tilde{b}_M) = \left(b_1, b_1, b_2, b_2, \ldots, b_{\frac{M}{2}}, b_{\frac{M}{2}}\right),$$

for which we showed above that $(\tilde{b}) \neq (\tilde{c})$. For the one-step cyclically shifted codeword to be equal to another codeword, we must have $$\left(b_{\frac{M}{2}}, b_1 b_1, b_2, \ldots, b_{\frac{M}{2}}\right) = \left(c_1, c_1, c_2, c_2, \ldots, c_{\frac{M}{2}}\right),$$

which results in that $$b_1 = b_2 = \ldots = b_{\frac{M}{2}},$$

which is impossible. Therefore, any cyclic shift of a codeword is not another codeword. Hence, the RCP is a cyclically permutable code.

End of Proof.

The first repetitive code created according to this embodiment of the invention is thus a cyclically permutable code and is therefore suitable for frame timing synchronization.

A second repetitive cyclically permutable (RCP) code $(\tilde{c}_1,\tilde{c}_2, \ldots, \tilde{c}_M)$ according to the invention can for odd M be constructed by:

$$\tilde{c}_k = \begin{cases} c_k & k = 1, 2, \ldots, \left\lceil \frac{M}{2} \right\rceil \\ c_{M+1-k} & k = \left\lceil \frac{M}{2} \right\rceil + 1, \ldots, M \end{cases}.$$

We have here created a second repetitive cyclically permutable code. We will now show that the codewords $(\tilde{c}_1,\tilde{c}_2, \ldots, \tilde{c}_M)$ of this second code constitute a cyclically permutable code by the following proof.

Start of Proof.

Consider a codeword $$(\tilde{c}_1, \tilde{c}_2, \ldots, \tilde{c}_M) = \left(c_1, c_2, \ldots, c_{\lceil \frac{M}{2} \rceil}, c_{\lceil \frac{M}{2} \rceil - 1}, \ldots, c_1\right).$$

For the one-step cyclically shifted codeword $(c_1, c_1, c_2, \ldots, c_3, c_2)$ to be equal to the non-shifted codeword, we must have $$c_1 = c_2 = \ldots = c_{\lceil \frac{M}{2} \rceil},$$

which is impossible, since the $$\left\lceil \frac{M}{2} \right\rceil$$

symbols long codeword $$\left(c_1, c_2, \ldots, c_{\lceil \frac{M}{2} \rceil}\right)$$

is cyclically permutable by assumption. Proceeding in the same manner, for every cyclic shift, the same criteria follows $$c_1 = c_2 = \ldots = c_{\lceil \frac{M}{2} \rceil}.$$

Hence the codeword $(\tilde{c}_1,\tilde{c}_2, \ldots, \tilde{c}_M)$ has M distinct shifts.

Since all the original $$\left\lceil \frac{M}{2} \right\rceil$$

symbols long codewords are unique by assumption, and the mapping to the M symbols long codewords is one-to-one, the codewords must also be unique. Therefore, each codeword is unique and has M distinct shifts.

Consider another codeword $$(\tilde{b}_1, \tilde{b}_2, \ldots, \tilde{b}_M) = (b_1, b_2, \ldots, b_{\lceil\frac{M}{2}\rceil}, b_{\lceil\frac{M}{2}\rceil-1}, \ldots, b_1),$$

for which we showed above that $(\tilde{b}) \neq (\tilde{c})$. For the one-step cyclically shifted codeword to be equal to another codeword, we must have $$(b_1, b_1, b_2, \ldots, b_3, b_2) = (c_1, c_2, \ldots, c_{\lceil\frac{M}{2}\rceil}, c_{\lceil\frac{M}{2}\rceil-1}, \ldots, c_1),$$

which results in that $$c_1 = c_2 = \ldots = c_{\lceil\frac{M}{2}\rceil},$$

which is impossible. Therefore, any cyclic shift of a codeword is not another codeword. Hence, it is a cyclically permutable code.

End of Proof.

The second repetitive code created according to the invention is thus also a cyclically permutable code and is therefore suitable for frame timing synchronization.

The construction of a repetitive cyclically permutable (RCP) code according to the invention assumes a cyclically permutable code to start with. Such codes can be generated in a number of ways as is clear for a skilled person. Hereafter two such exemplary ways are shortly described.

One way of generating cyclically permutable codes in a systematic and simple fashion could be the following. Suppose that N=64 and M=4. A cyclically permutable code of length 2 can, e.g., be found by the set of code words $\{(c_1,c_2):(1,2), (1,3), \ldots, (1,64), (2,3), (2,4), \ldots, (2,64), (3,4), \ldots, (3,64), \ldots\}$. In total there are at most 63+62+61+ . . . +1=2016 codewords.

A repetitive cyclically permutable (RCP) code according to the invention can then be constructed by having these sets of codewords $\{(c_1,c_2):(1,2), (1,3), \ldots, (1,64), (2,3), (2,4), \ldots, (2,64), (3,4), \ldots, (3,64), \ldots\}$ as a starting point. Following the RCP code construction for even M given above, $\tilde{c}_{2k-1}=\tilde{c}_{2k}=c_k$, k=1,2, . . . , M/2, the new set of extended codewords according to the invention is; $\{(1,1,2,2), (1,1,3,3), \ldots, (1,1,64,64), (2,2,3,3), (2,2,4,4), \ldots, (2,2,64,64), (3,3,4,4), \ldots, (3,3,64,64), \ldots\}$.

One other way of generating cyclically permutable codes is described in reference document [3]. A technique (proposed by Bose and Caldwell) for generating a cyclically permutable code from a cyclic block code (the RS code) is described in this document. Such techniques may as well be used as the foundation in the above code construction.

The main principle of the RCP code construction according to the invention is that it imposes a structure to the codewords. A time repetitive structure, which will be utilized in the decoder for determining time shifts and to provide means for diversity combining of repeated symbols, is added to the code.

It should be noted that the concatenation of $$(c_1, c_2, \ldots, c_{\lceil\frac{M}{2}\rceil}, c_1, c_2 \ldots, c_{\lceil\frac{M}{2}\rceil})$$

is a repetition code which would provide larger separation between the symbols and therefore larger time diversity, but this is not a cyclically permutable codeword. Such a code construction is therefore not suitable for synchronization and does thus not solve our stated problem.

The code constructions described above uses a repetition factor of 2, i.e. each element is repeated twice within the codeword. Larger repetition factors could, however, also be considered. Larger repetition factors would imply better diversity but would also decrease the number of codewords. Better diversity in the decoding is favorable, but to decrease the number of codewords is not desirable from a cell search perspective.

Throughout this description, exemplary embodiments of RCP codes according to the invention with repetition factor 2 are mainly described. The invention can however be generalized to more than two repetitions. This can for instance be done according to the following.

If we have a cyclically permutable code $c=(c_k)$ of length n, such that no codeword is a cyclic shift of another codeword and each codeword has unique cyclic shifts, the construction of codewords $\tilde{c}=(\tilde{c}_k)$ of length n·t can be done by t>1 consecutive repetitions of each codeword element $\tilde{c}_{tk-t+1}= \ldots =\tilde{c}_{tk}=c_k$, k=1,2, . . . ,n.

This can also be done, having a cyclically permutable code with codewords $c=(c_k)$ of length n as a starting point, by constructing codewords $\tilde{c}=(\tilde{c}_k)$ of length (n−1)·t+1 by t>1 consecutive repetitions of n−1 codeword elements $\tilde{c}_{tk-t+1}= \ldots =\tilde{c}_{tk}=c_k$, k=1,2, . . . ,n−1 and $\tilde{c}_{(n-1)\cdot t+1}=c_n$.

There are, as is clear for a person skilled in the art, many ways of creating these RCP codes. The methods for creation of repetitive cyclically permutable codes given above are only a couple of exemplary embodiments of how this can be done. The general idea of the invention can be utilized in a number of ways. A skilled person realizes that the invention can be generalized to imposing any kind of repetitive structure to a cyclically permutable code.

As long as the repetitive structure is applied for all the codewords in the code, the decoding procedure according to the invention will reduce the complexity of the decoder. This differs from background art synchronization codes. In table 4 in reference document [1] it can be seen that for instance groups 15-21 do not contain repetitive codewords. The code defined in the 3GPP standard document does thus not have a repetitive structure for all codewords of the code. The code defined in table 4 in reference document [1] could thus not be used to reduce the decoding complexity according to the present invention.

The decoding procedure will hereafter be described. The decoder shall determine the codeword and its cyclic shift. The decoding of the above RCP code utilizes the repetitive code structure of the code and is done in four steps that will be described hereafter. These four decoding steps are:

calculation of metrics corresponding to probabilities that a certain value was transmitted for an element in a codeword, hypothesis testing and diversity combining, codeword detection, codeword verification.

Decoding Step 1: Metrics Calculation

For each received synchronization symbol, 1≤m≤M, the receiver computes for the possible SCH sequences/symbols 1≤k≤N a metric $\rho_{km}$. This may, e.g., be the magnitude of a correlator output, or some other soft output of a decoder. A large value of $\rho_{km}$ should indicate that sequence k was transmitted in slot m with high probability. A graph of this correlator output for one slot has thus typically an amplitude peak for the symbol k that was transmitted and has considerably lower amplitude for other k.

As a numerical example, if a codeword (1,1,2,2) of length 4 (M=4) has been received, correlations are calculated for each of the four slots in order to estimate the probabilities for which symbol that was transmitted in each slot. This is done in order to estimate which symbols that were probably transmitted in each slot, in other words, which values the elements of the transmitted codeword probably have. For the codeword of this example, codeword (1,1,2,2), the graphs of the correlations $\rho_{km}$ for the first and second slots will have a peak for the value "1" whereas the graphs of the correlations for the third and fourth slots will have a peak for the value "2".

It may be noted that the correlation values $\rho_{km}$ may in turn be obtained as averages over several radio frames.

Decoding Step 2: Hypothesis Testing and Diversity Combining

The imposed repetitive structure of the code will, in this decoding step, be exploited in two ways: to reduce the number of cyclic shifts to be evaluated, and to diversity combine decoder metrics of the elements that have the same values.

To determine which codeword elements that have the same values, that is to determine which codeword elements that can be diversity combined, the receiver evaluates a set of hypotheses.

As an example, hypothesis testing is here shown for the RCP code having a repetition factor 2 given above, created by, for M even:

$$\tilde{c}_{2k-1} = \tilde{c}_{2k} = c_k, \quad k = 1, 2, \ldots, M/2,$$

and for M odd:

$$\tilde{c}_{2k-1} = \tilde{c}_{2k} = c_k, \quad k = 1, 2, \ldots, \left\lceil \frac{M}{2} \right\rceil - 1,$$

$$\tilde{c}_M = c_{\left\lceil \frac{M}{2} \right\rceil}.$$

For even M, there are always only two such hypotheses for this particular code, H0 and H1. These hypotheses describe which consecutive elements of a received codeword $\tilde{r}=(\tilde{r}_i)$ that, according to each hypothesis, have the same values:

$H0:(\tilde{r}_1=\tilde{r}_2)\&(\tilde{r}_3=\tilde{r}_4)\& \ldots \&(\tilde{r}_{M-1}=\tilde{r}_M)$ $H1:(\tilde{r}_2=\tilde{r}_3)\&(\tilde{r}_4=\tilde{r}_5)\& \ldots \&(\tilde{r}_M=\tilde{r}_1)$ Associated with each hypothesis, are M/2 sets, containing the indices to symbols that can be combined, that is codeword elements that can be diversity combined if the hypothesis is correct.

Having evaluated H0 and H1 and chosen one of them, say H0, as the correct one, the metrics of the codeword elements are diversity combined according to the sets of H0. How to generally evaluate hypotheses is mathematically described in more detail later in this section.

For codewords of the length M, where M is odd, a cyclic shift results in that the M:th codeword element can appear at M positions, thus there are M hypotheses to evaluate.

If there are as many possible cyclic shifts of a codeword as there are hypotheses, the correct hypothesis determines both the elements that could be combined and the actual frame timing. Hence no further cyclic shifts would need to be evaluated for detecting the cell ID. Since the hypothesis testing does not include any cell ID detection, it would in this case mean that, frame timing can be obtained before and without having to determine the cell ID. It can be observed that in the special case of M being odd and all codewords have the property $\tilde{c}_M \neq \tilde{c}_1$ & $\tilde{c}_M \neq \tilde{c}_{M-1}$, there are as many possible cyclic shifts of the codewords as there are hypotheses, see the following example.

If we, for example, analyze a codeword (1,1,2,2,3) and its cyclic shifts (3,1,1,2,2), (2,3,1,1,2), (2,2,3,1,1) and (1,2,2,3,1), we realize that each of these shifts corresponds to one hypothesis each, i.e., in total 5 hypotheses.

$H0:(\tilde{r}_1=\tilde{r}_2)\&(\tilde{r}_3=\tilde{r}_4)$ $H1:(\tilde{r}_2=\tilde{r}_3)\&(\tilde{r}_4=\tilde{r}_5)$ $H2:(\tilde{r}_1=\tilde{r}_5)\&(\tilde{r}_3=\tilde{r}_4)$ $H3:(\tilde{r}_1=\tilde{r}_2)\&(\tilde{r}_4=\tilde{r}_5)$ $H4:(\tilde{r}_1=\tilde{r}_5)\&(\tilde{r}_2=\tilde{r}_3)$ Clearly, since all of the 5 cyclic shifts belong to different hypotheses, the correct hypothesis determines which elements to combine and, additionally, also the actual frame timing.

If we instead analyze a codeword (1,1,2,2,2) and its cyclic shifts (2,1,1,2,2), (2,2,1,1,2), (2,2,2,1,1) and (1,2,2,2,1), by testing the hypotheses H0-H4 defined above, we will be able to determine which two elements to diversity combine with each other. But, the frame timing may not be obtained directly from the correct hypothesis because more than one codeword are true under each hypothesis. E.g., both (1,1,2,2,2) and (2,2,1,1,2) are true under H0, both (2,1,1,2,2) and (2,2,2,1,1) are true under H1 etc.

The hypothesis testing and diversity combining procedures will now be described mathematically.

According to the invention, hypotheses should be evaluated and diversity combining should be performed by calculating, for each hypothesis h and its associated index sets $R_{hj}$, for all j:

$$D_{kj}(h) = \sum_{m \in R_{hj}} \rho_{km}, \qquad (1)$$

and choose the hypothesis Hx, for which $$x = \underset{h}{\operatorname{argmax}} \sum_j \max_k D_{kj}(h), \qquad (2)$$

where $\rho_{km}$ relates to the probability that sequence k was transmitted in slot m and $R_{hj}$ are index sets indicating sets of codeword elements under hypothesis h having the same value.

In equation 1, the diversity combining of the metrics is done according to the timing which the hypothesis defines, that is diversity combining is here performed in accordance with the hypothesis.

By the hypothesis testing and diversity combining in decoding step 2 according to the invention, the decoder has both narrowed down the possible cyclic shifts and computed new metrics $D_{kj}$ by diversity combining. Less complex computation in the following decoding steps, compared to background art methods, can therefore be achieved.

In an illustrative numerical example for a code with M=4, the codeword (1,1,2,2) and its cyclic shifts (2,1,1,2), (2,2,1,1) and (1,2,2,1) can be considered. For determining which codeword element correlations to diversity combine, out of the in total 4 codeword elements, two hypotheses are tested:

$$H0: (\tilde{r}_1 = \tilde{r}_2) \& (\tilde{r}_3 = \tilde{r}_4)$$

$$H1: (\tilde{r}_1 = \tilde{r}_4) \& (\tilde{r}_2 = \tilde{r}_3)$$

The codewords (1,1,2,2) and (2,2,1,1) are captured under H0, and the other two under H1. Index sets associated with hypothesis H0 can be defined as $R_{01}=\{1,2\}$ and $R_{02}=\{3,4\}$. These index sets here correspond to the codeword elements that, according to hypothesis H0, have the same values and therefore also should be diversity combined. The first and the second codeword element have the same values in H0 and the third and the fourth codeword elements also have the same value, index sets $R_{01}=\{1,2\}$ and $R_{02}=\{3,4\}$ can therefore be derived. For hypothesis H1, index sets $R_{11}=\{1,4\}$ and $R_{12}=\{2,3\}$ can be defined in the same way. At this step of hypothesis testing it is not necessary to decode any codeword, only a correct hypothesis is sought. Once the hypothesis is detected (H0 or H1), the correlations are diversity combined according to the detected hypothesis, and decoding of cell ID starts. Note that the frame timing is not directly obtained once the correct hypothesis is determined, there are still a number of codewords that belong to the same hypothesis, e.g. (1,1,2,2) and (2,2,1,1) for H0, and frame timing is obtained first when one of these codewords belonging to then hypothesis is chosen as the transmitted codeword.

As previously the in the numerical example in decoding step 1 (metrics calculation) above, the graphs of the correlations $\rho_{km}$ for the codeword (1,1,2,2) will have a peak for the value "1" in the first and second slots whereas the graphs of the correlations $\rho_{km}$ for the third and fourth slots will have a peak for the value "2".

If these peaks all have amplitude=1, then a perfect reception of the codeword (1,1,2,2) would result in $\rho_{11}=\rho_{12}=\rho_{23}=\rho_{24}=1$ (amplitude) and all other $\rho_{km}=0$ (amplitude). Equation 1 above then adds these correlation vectors together according to the index sets corresponding to the two hypotheses, that is for H0 index sets $R_{01}=\{1,2\}$ and $R_{02}=\{3,4\}$ are used and for hypothesis H1 index sets $R_{11}=\{1,4\}$ and $R_{12}=\{2,3\}$ are used.

For H0, the correlations for the index set $R_{01}=\{1,2\}$ are first summed for the received codeword (1,1,2,2). Both first and second elements of the codeword have the value "1". $\rho_{km}$ for both the first and the second element thus have a peak for value "1" and these the correlations $\rho_{km}$ are summed together to a big peak for the value "1". This peak has an amplitude=2, since $\rho_{11}=\rho_{12}=1$. The graph of $D_{kj}(0)$ in equation 1 will thus be a correlation graph having a peak of amplitude=2 for the value "1" and amplitude zero for the rest of the values. Then the correlations for the index set $R_{02}=\{3,4\}$ are also summed for the received codeword (1,1,2,2). Since both third and fourth elements of the codeword have the value "2" the correlations are added together to a big peak for the value "2", this peak having an amplitude=2. The graph of $D_{kj}(0)$ in equation 1 will thus be a correlation graph having a peak of amplitude 2 for the value "2" and amplitude zero for the rest of the values.

For hypothesis H0, equation 2 then searches for the maximum values of $D_{kj}(0)$ corresponding to R01 and R02 and adds these maximum values together. This results in $$\sum_j \max_k D_{kj}(0) = 4,$$

since both Dkj(0) corresponding to R01 and Dkj(0) corresponding to R02 have a peak amplitude=2.

If the same procedure is performed for hypothesis H1 for the codeword (1,1,2,2), the summations of correlations $\rho_{km}$ according to hypothesis H1 using index sets $R_{11}=\{1,4\}$ and $R_{12}=\{2,3\}$ in equation 1 will result in Dkj(1):s having two peaks of amplitude 1. This since, for example, addition according to index set $R_{11}=\{1,4\}$ adds the first and the fourth codeword element. The correlation curves $\rho_{km}$ for the first and fourth element have peaks in different positions since the elements have different values, the curve for the first element has a peak for the position of value "1" and the curve for the fourth element has a peak for the position of value "2". When these correlations are added together the graph of the summation thus has two peaks of amplitude 1, one for value "1" and one for value "2".

For hypothesis H1, equation 2 then searches for the maximum values of Dkj(1) corresponding to R11 and R12 and adds these maximum values together. This results in $$\sum_j D_{kj}(1) = 2,$$

since both Dkj(1) corresponding to R11 and Dkj(1) corresponding R12 have a maximum amplitude=1.

Thus, using the hypotheses H0 and H1 defined above in this example, it follows that $$\sum_j \max_k D_{kj}(0) = 4$$

for H0 and $$\sum_j D_{kj}(1) = 2$$

for H1. This shows that, the energy of all the symbols are added under hypothesis H0, whereas under the wrong hypothesis (H1) only the energy of one symbol per index set is captured. We therefore get a larger value for hypothesis H0 here, since H0 is the correct hypothesis. This can be used for selecting hypothesis, simply by choosing the hypothesis rendering the largest value of $D_{kj}$.

Decoding Step 3: Codeword Detection

In the codeword detection step, the codeword elements can be determined in at least two different ways. One way of detecting the elements is new for the present invention and one way is derived from maximum likelihood criterion.

First the new detection method is presented. According to this detection method the detection is performed as:

for the chosen hypothesis Hx, for all j, and $p \in R_{xj}$, let the detected codeword $s=(s_p)$ be:

$$s_p = \arg\max_k D_{kj}(x). \qquad (3)$$

This procedure allocates the codeword elements from the diversity combined metrics $D_{kj}(x)$.

The computed metrics $D_{kj}$ from equation 1 are reused in equation 3 for codeword decoding, which is performed by a single maximization operation. If the hypothesis test in decoding step 2 is accurate, metrics have already been correctly combined in decoding step 2 and the maximization step in equation 3 should assure good performance.

Since the number of tested hypotheses in general is much lower than the number of codewords and their cyclic shifts, less metric computations are foreseen and a lower decoding complexity can be maintained. In comparison, the maximum likelihood scheme in reference document [3], computes one metric $$\sum_{i=1}^{M} \rho_{\tilde{c}_i i}$$

for each codeword $(\tilde{c}_1, \tilde{c}_2, \ldots, \tilde{c}_M)$ and each cyclic shift thereof and then compares all of them to get the maximum one.

It is noted that in the above method described in decoding steps 1-3, after the choice of hypothesis, the number of remaining and eligible cyclic shifts of the codewords has been reduced, only those under the chosen Hx remain. For the exemplary code described on page 11, for even M, the number of time shifts has been reduced by 2 and for odd M it is reduced by a factor M.

As was mentioned above, a method derived from a maximum likelihood criterion can also be used for codeword detection in decoding step 3. Codeword detection according to this method is, for the chosen hypothesis Hx and all codewords $\tilde{c} \in \Phi$, where the set $\Phi$ contains the codewords and cyclic shifts thereof that may be true under Hx, performed as:

$$s = \underset{\tilde{c} \in \Phi}{\operatorname{argmax}} \sum_{i=1}^{M} \rho_{\tilde{c}_i i}, \quad (4)$$

where s is the detected codeword.

It should be noted that, if this maximum likelihood criterion is used for the present invention it still differs from pure maximum likelihood methods as the one shown in reference document [3]. According to this invention decoding steps 1 and 2 are first performed according to the invention and the maximum likelihood criterion is only used in decoding step 3. That is, only time shifts under the chosen hypothesis are evaluated in the method. In pure maximum likelihood methods as the one described in reference document [3], all codewords and all cyclic shifts thereof are evaluated, not only the ones under the chosed hypothesis as in the present invention.

Decoding Step 4: Codeword Verification

Finally it is verified whether the resulting codeword $(s_1, s_2, \ldots, s_M)$ is a valid cyclically shifted codeword. This is done by comparing it to all possible codewords and cyclic shifts of codewords under the chosen hypothesis. If the detected codeword is a valid codeword, the frame timing and cell ID is determined correctly. If it is not, a decoding error should be declared.

Note that the calculations also in this step are reduced by the present invention since the detected codeword only has to be compared to possible codewords and cyclic shifts of codewords under the chosen hypothesis and not to all possible codewords and cyclic shifts of codewords.

Performance evaluation will now be discussed.

The whole decoding procedure has now been presented. In the following sections the performance and the complexity of the present invention is described.

The main goal of the present invention is to lower the decoding complexity. The performance of the invention in terms of decoding complexity is hereafter discussed. Decoding complexity is analyzed in terms of number of operations per decoded codeword, assuming a repetition factor of 2, for the exemplary code given on page 11.

For the RCP code according to the invention in decoding step 1 and 2, there will be N·M/2·H [elements/index set*index sets*hypotheses] additions of correlation values where H is the number of hypotheses (H=2 for M even, and H=M for M odd). So the number of computations is linear or quadratic in the code length M, linear in the sequence space N but, importantly, for a given N and M, independent of the number of codewords of the code. In decoding step 3, the maximum operator is applied M/2 times on a vector of length N.

As a comparison, for completing a pure maximum likelihood decoding, according to for example reference document [3], all codewords and cyclic shifts are evaluated according to $$\sum_{i=1}^{M} \rho_{\tilde{c}_i i}.$$

If the code has W codewords, there will in total be W·M² [codewords*elements/codeword*cyclic shifts] additions of correlation values, where the square on M accounts for the cyclic shifts. So the number of computations is always quadratic in the code length M, linear in the number of codewords but independent of the sequence space N. The final maximum operator is applied 1 time to a vector of length W·M.

Thus, the proposed RCP code according to the invention will reduce the decoding complexity in the correlation computations and maximization operations for codes with large amount of codewords (W>>N) and/or long code lengths. For even M, the decoding complexity reduction is a factor MW/N and for odd M, a factor 2W/N. Thus the RCP code is suitable to, e.g., non-hierarchical cell search, where a larger number of codewords must be handled.

Figure 1:
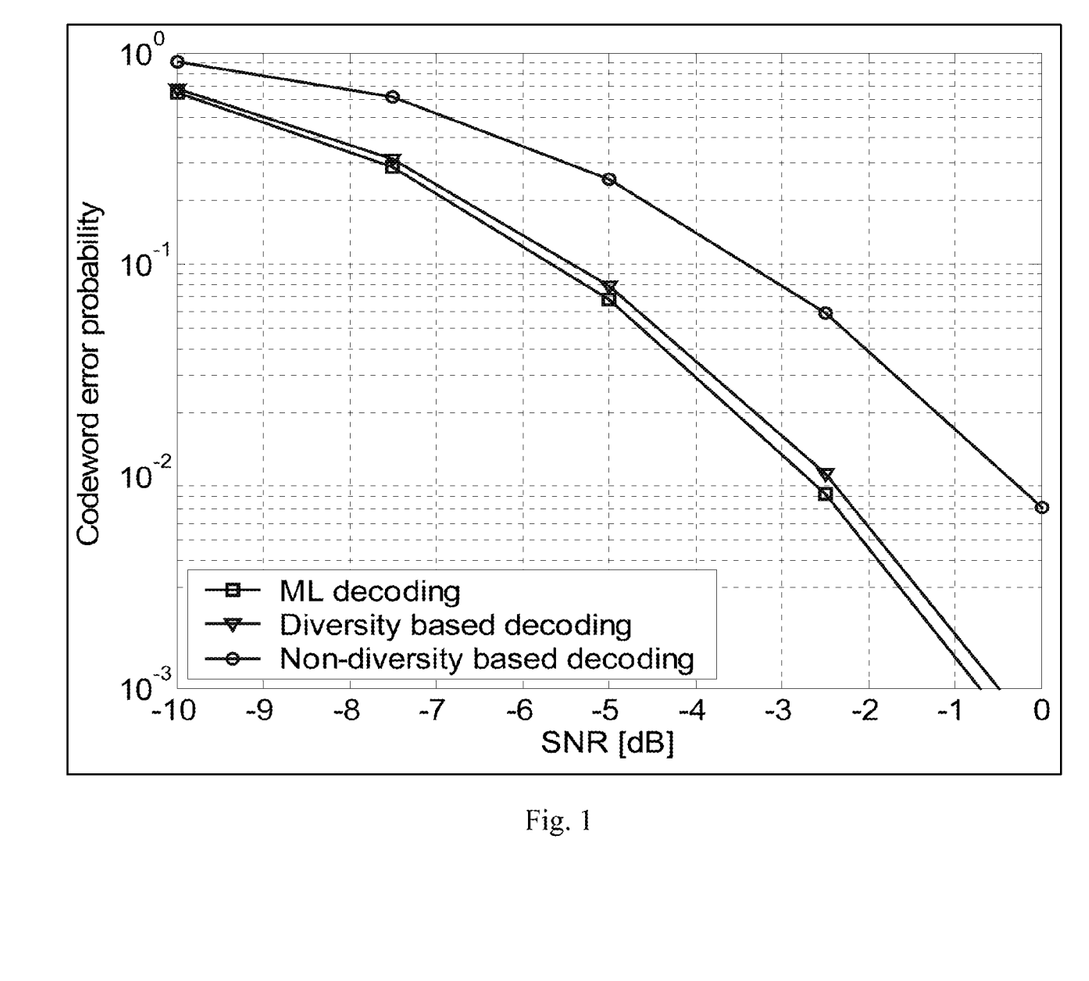
FIG. 1 shows performance simulations for an embodiment of the present invention and for two methods of prior art.
Figure 2:
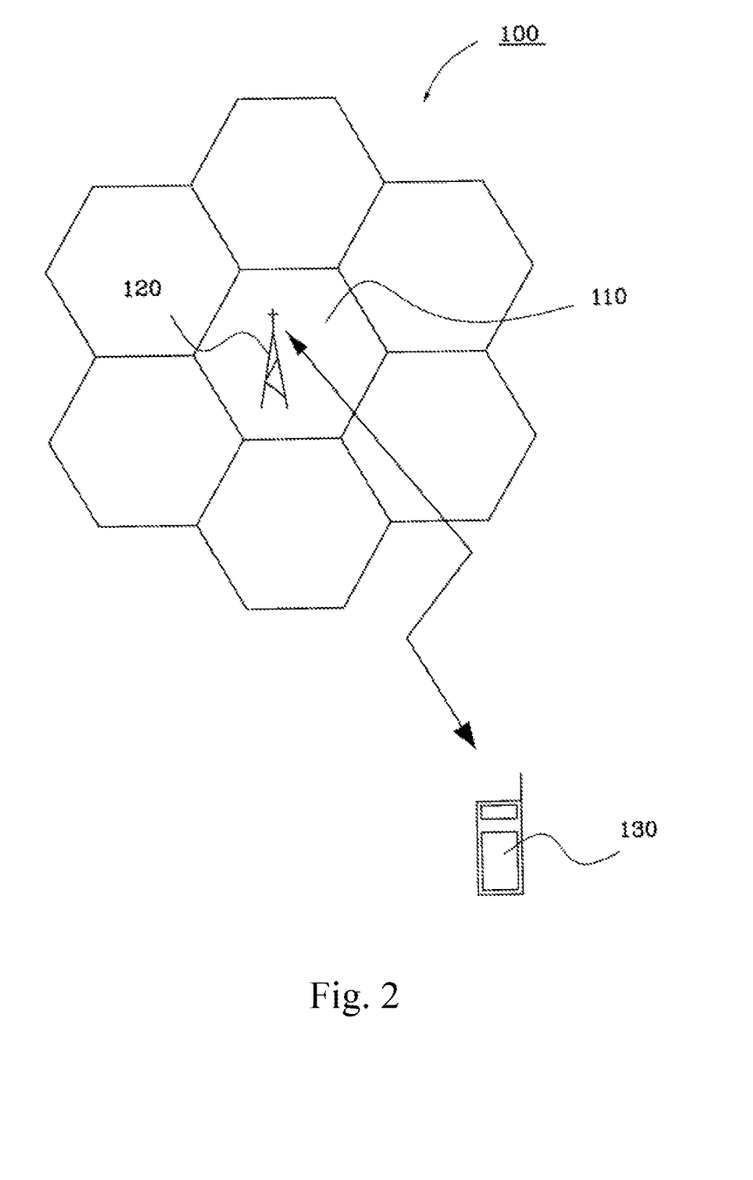
FIG. 2 shows a mobile communication system including a base station serving a cell of the system, and a user equipment communicating with the base station in accordance with an embodiment of the present invention.

In FIG. 1, the code described above in the section of code construction, having the set of codewords: $\{(1,1,2,2), (1,1,3,3), \ldots, (1,1,64,64), (2,2,3,3), (2,2,4,4), \ldots, (2,2,64,64), (3,3,4,4), \ldots, (3,3,64,64), \ldots \}$, has been numerically evaluated.

From the code, 1024 codewords have been selected. Simulations are done in an OFDM simulator, following the working assumptions of E-UTRA. The synchronization sequences and the detector are described further in reference document [9]. The error probabilities of three decoding methods are plotted: (1) Maximum likelihood (ML) detection (optimal), (2) he proposed method of the present invention, and (3) a method which decodes each codeword element independently, $$s_m = \underset{k}{\operatorname{argmax}} \rho_{km},$$

not using any diversity combining.

Method 3 can be regarded as a method not offering any coding gain, as the elements are decoded individually. For methods 2 and 3, an error event is counted also if a decoding error is declared.

It can be seen that the proposed method 2 is close to the optimal ML method within a fraction of one dB. The loss of not using the inherent diversity structure in the code is shown by the much worse performance of the last method, method 3. Hence the suggested method 2 is expected to not significantly increase the cell search time, while having a much simpler decoding procedure than ML.

In the ML decoding according to method 1, the correct codeword is found if its metric is larger than those of all the other codewords. Hence, increasing the number of codewords, the error probability will become worse, as more erroneous codeword candidates need to be compared. The same effect occurs for ML decoding if M increases, as there are then more cyclic shifts to consider.

Therefore, the performance gain of ML over the proposed decoding algorithm of the present invention will decrease as the number of codewords becomes larger. Thus the RCP code is suitable to e.g. a non-hierarchical cell search, where a larger number of codewords must be coped with.

The invention can further be used in all applications where the synchronization signals, transmitted to support and alleviate the timing acquisition in the receiver, also carry some information, such as an identification number of a transmitter etc. One such application is the cell search procedure in the cellular systems. A skilled person realizes that there are more such applications for the invention.

The given synchronization code of the invention, can be used in both non-hierarchical and hierarchical synchronization channels. The invention is also not restricted to OFDM signals, it can be used for all kinds of telecommunication systems as is clear to a skilled person.

The repetitive code structure may also be utilized in the channel estimation and can further be used in other signaling in a telecommunication system.

The code creation and decoding according to the invention may be modified by those skilled in the art, as compared to the exemplary embodiments described above.

The following reference documents are referred to in this specification.

[1] 3GPP TS 25.213 v7.0.0, "Spreading and modulation (FDD)".
[2] Y.-P. E. Wang and T. Ottosson, "Cell Search in W-CDMA", *IEEE J. Sel. Areas Commun.*, vol. 18, pp. 1470-1482, August 2000.
[3] S. Sriram and S. Hosur, "Cyclically Permutable Codes for Rapid Acquisition in DS-CDMA Systems with Asynchronous Base Stations", *IEEE J. Sel. Areas Commun.*, vol. 19, pp. 83-94, January 2000.
[4] M. Tanda, "Blind Symbol-Timing and Frequency-Offset Estimation in OFDM Systems with Real Data Symbols," *IEEE Trans. Commun.*, vol. 52, pp. 1609-1612, October 2004.
[5] B. M. Popovic, "Synchronization signals for timing acquisition and information transmission", PCT/CN2006/000076, Huawei, 2006.
[6] T. M. Schmidl and D. C. Cox, "Robust Frequency and Timing Synchronization for OFDM", *IEEE Trans. Commun.*, vol. 45, pp. 1613-1621, December 1997.
[7] ETRI, "Cell Search Scheme for EUTRA", R1-060823, Athens, Greece, Mar. 27-31, 2006.
[8] Huawei, "Additional Link-level Evaluation of Cell Search Times for Non-hierarchical and Hierarchical SCH Signals", R1-061817, Cannes, France, Jun. 27-30, 2006.
[9] Huawei, "Cell Search Times of Hierarchical and Non-hierarchical SCH Signals", R1-061248, Shanghai, China, May 8-12, 2006.
[10] Huawei, "System-level Evaluation of Cell Search Times for Non-hierarchical and Hierarchical SCH Signals", R1-061818, Cannes, France, Jun. 27-30, 2006.

What is claimed is:

1. A method of facilitating synchronization between a base station (BS) and a user equipment (UE) in a mobile communication system, the method comprising:
   determining, by the BS, a cyclically permutable (CP) codeword based on a set of CP codewords in accordance with a Cell ID; and
   encoding, by the BS, the selected CP codeword into a synchronization signal to be sent to the UE, the encoding being facilitated by deriving a repetitive cyclically permutable (RCP) codeword from the CP codeword and encoding the RCP codeword into the synchronization signal, wherein the RCP codeword has a plurality of codeword elements, wherein each codeword element of the plurality of codeword elements is associated with a value, wherein the value of at least one codeword element in the RCP codeword is repeated in another codeword element position in the RCP codeword, wherein the synchronization signal comprises a plurality of synchronization sequences transmitted in a radio frame, and wherein allocation of the plurality of synchronization sequences to a plurality of slots of the radio frame is performed in accordance with the RCP codeword.

2. The method of claim 1, wherein the set of CP codewords is expressed as:

$$\left(c_1, c_2, \ldots, c_{\lceil \frac{M}{2} \rceil}\right),$$

where $$\left\lceil \frac{M}{2} \right\rceil$$

is the smallest integer not less than M/2, $$0 \leq c_1, c_2, \ldots, c_{\lceil \frac{M}{2} \rceil} \leq N,$$

and M, N are positive integers, M is a quantity of the plurality of synchronization sequences.

3. The method of claim 2, wherein N=64, M=4 and the set of CP codewords is:
{(c$_1$,c$_2$):(1,2), (1,3), . . . , (1,64), (2,3), (2,4), . . . , (2,64), (3,4), . . . , (3,64), . . . (63,64)}.

4. The method of claim 2, wherein the RCP codeword is expressed as ($\tilde{c}_1, \tilde{c}_2, \ldots, \tilde{c}_M$) with $\tilde{c}_{2k-1}=\tilde{c}_{2k}=c_k$, k=1,2, . . . , M/2, where M is an even number.

5. The method of claim 4, wherein N=64, M=4, and the RCP codeword is included in the following: {(1,1,2,2), (1,1,3,3), . . . , (1,1,64,64), (2,2,3,3), (2,2,4,4), . . . , (2,2,64,64), (3,3,4,4), . . . , (3,3,64,64), . . . (63,63,64,64)}.

6. The method of claim 4, wherein M=4, the RCP codeword is expressed as ($\tilde{c}_1,\tilde{c}_2, \ldots,\tilde{c}_M$)=(c$_1$,c$_1$,c$_2$,c$_2$) and a plurality of cyclic shifts are derivable from the RCP codeword, which is expressed as: (c$_2$,c$_1$,c$_1$,c$_2$), (c$_2$,c$_2$,c$_1$,c$_1$), (c$_1$,c$_2$,c$_2$,c$_1$) and (c$_1$,c$_1$,c$_2$,c$_2$).

7. The method of claim 2, wherein the RCP codeword is expressed as ($\tilde{c}_1,\tilde{c}_2, \ldots,\tilde{c}_M$) with $$\tilde{c}_{2k-1} = \tilde{c}_{2k} = c_k,$$

$$k = 1, 2, \ldots, \left\lceil \frac{M}{2} \right\rceil - 1,$$

$$\tilde{c}_M = c_{\left\lceil \frac{M}{2} \right\rceil},$$

where M is an odd number.

8. The method of claim 2, wherein M=4, and the set of CP codewords is expressed as $(c_1, c_2)$.

9. An apparatus comprising at least one circuitry configured to:
   determine a cyclically permutable (CP) codeword based on a set of CP codewords in accordance with a Cell ID; and
   encode the CP codeword into a synchronization signal to be sent to a user equipment (UE), the encoding being facilitated by deriving a repetitive cyclically permutable (RCP) codeword from the CP codeword and encoding the RCP codeword into the synchronization signal, wherein the RCP codeword has a plurality of codeword elements, wherein each codeword element of the plurality of codeword elements is associated with a value, wherein the value of at least one codeword element in the RCP codeword is repeated in another codeword element position in the RCP codeword, wherein the synchronization signal comprises a plurality of synchronization sequences transmitted in a radio frame, and wherein allocation of the plurality of synchronization sequences to a plurality of slots of the radio frame is performed in accordance with the RCP codeword.

10. The apparatus of claim 9, wherein the set of CP codewords is expressed as:

$$\left( c_1, c_2, \ldots, c_{\left\lceil \frac{M}{2} \right\rceil} \right),$$

where $$\left\lceil \frac{M}{2} \right\rceil$$

is the smallest integer not less than M/2, $$0 \le c_1, c_2, \ldots, c_{\left\lceil \frac{M}{2} \right\rceil} \le N,$$

and M, N are positive integers, M is a quantity of the plurality of synchronization sequences.

11. The apparatus of claim 10, wherein the RCP codeword is expressed as $(\tilde{c}_1, \tilde{c}_2, \ldots, \tilde{c}_M)$ with $\tilde{c}_{2k-1} = \tilde{c}_{2k} = c_k$, $k=1,2,\ldots,M/2$, where M is an even number.

12. The apparatus of claim 11, wherein M=4, the RCP codeword is expressed as $(\tilde{c}_1, \tilde{c}_2, \ldots, \tilde{c}_M) = (c_1, c_1, c_2, c_2)$, and a plurality of cyclic shifts being derivable from the RCP codeword is expressed as: $(c_2, c_1, c_1, c_2)$, $(c_2, c_2, c_1, c_1)$, $(c_1, c_2, c_2, c_1)$ and $(c_1, c_1, c_2, c_2)$.

13. The apparatus of claim 10, wherein the RCP codeword is expressed as $(\tilde{c}_1, \tilde{c}_2, \ldots, \tilde{c}_M)$ with $$\tilde{c}_{2k-1} = \tilde{c}_{2k} = \tilde{c}_k,$$

$$k = 1, 2, \ldots, \left\lceil \frac{M}{2} \right\rceil - 1,$$

$$\tilde{c}_{M'} = c_{\left\lceil \frac{M}{2} \right\rceil}$$

where M is an odd number.

14. The apparatus of claim 10, wherein M=4, the set of CP codewords is expressed as $(c_1, c_2)$.

15. A method of facilitating synchronization between a base station (BS) and a user equipment (UE) in a mobile communication system, the method comprising:
   receiving a synchronization signal originated by the BS, wherein the synchronization signal is encoded with a cyclically permutable (CP) codeword, the CP codeword being determined based on a set of CP codewords in accordance with a Cell ID, the encoding of the synchronization signal being facilitated by deriving a repetitive cyclically permutable (RCP) codeword from the CP codeword and encoding the RCP codeword into the synchronization signal, the RCP codeword having a plurality of codeword elements, wherein each codeword element of the plurality of codeword elements is associated with a value, wherein the value of at least one codeword element in the RCP codeword is repeated in another codeword element position in the RCP codeword, wherein the synchronization signal comprises a plurality of synchronization sequences transmitted in a radio frame, and wherein allocation of the plurality of synchronization sequences to a plurality of slots of the radio frame is performed in accordance with the RCP codeword; and
   decoding the Cell ID from the synchronization signal in accordance with repetitive structure of the RCP codeword.

16. The method of claim 15, wherein the set of CP codewords is expressed as:

$$\left( c_1, c_2, \ldots, c_{\left\lceil \frac{M}{2} \right\rceil} \right),$$

where $$\left\lceil \frac{M}{2} \right\rceil$$

is the smallest integer not less than M/2, $$0 \le c_1, c_2, \ldots, c_{\left\lceil \frac{M}{2} \right\rceil} \le N,$$

and M, N are positive integers, M is a quantity of the plurality of synchronization sequences.

17. The method of claim 16, wherein the RCP codeword is expressed as $(\tilde{c}_1, \tilde{c}_2, \ldots, \tilde{c}_M)$ with $\tilde{c}_{2k-1} = \tilde{c}_{2k} = c_k$, $k=1,2,\ldots,M/2$, where M is an even number.

18. The method of claim 17, wherein M=4, the RCP codeword is expressed as $(\tilde{c}_1, \tilde{c}_2, \ldots, \tilde{c}_M) = (c_1, c_1, c_2, c_2)$, and a plurality of cyclic shifts being derivable from the RCP codeword is expressed as: $(c_2, c_1, c_1, c_2)$, $(c_2, c_2, c_1, c_1)$, $(c_1, c_2, c_2, c_1)$ and $(c_1, c_1, c_2, c_2)$.

19. The method of claim 16, wherein the RCP codeword is expressed as $(\tilde{c}_1,\tilde{c}_2,\ldots,\tilde{c}_M)$ with $$\tilde{c}_{2k-1} = \tilde{c}_{2k} = \tilde{c}_k,$$
$$k = 1, 2, \ldots, \left\lceil \frac{M}{2} \right\rceil - 1,$$
$$\tilde{c}_M = c_{\lceil \frac{M}{2} \rceil}$$

where M is an odd number.

20. The method of claim 16, wherein M=4, and the set of CP codewords is expressed as $(c_1,c_2)$.

21. An apparatus comprising at least one circuitry configured to:
receive a synchronization signal originated by a base station, wherein the synchronization signal is encoded with a cyclically permutable (CP) codeword, the CP codeword being determined based on a set of CP codewords in accordance with a Cell ID, the encoding of the synchronization signal being facilitated by deriving a repetitive cyclically permutable (RCP) codeword from the CP codeword and encoding the RCP codeword into the synchronization signal, the RCP codeword having a plurality of codeword elements, wherein each codeword element of the plurality of codeword elements is associated with a value, wherein the value of at least one codeword element in the RCP codeword is repeated in another codeword element position in the RCP codeword, wherein the synchronization signal comprises a plurality of synchronization sequences transmitted in a radio frame, and wherein allocation of the plurality of synchronization sequences to a plurality of slots of the radio frame is performed in accordance with the RCP codeword; and
decode the Cell ID from the synchronization signal in accordance with repetitive structure of the RCP codeword.

22. The apparatus of claim 21, wherein the set of CP codewords is expressed as:

$$\left(c_1, c_2, \ldots, c_{\lceil \frac{M}{2} \rceil}\right),$$

where $$\left\lceil \frac{M}{2} \right\rceil$$

is the smallest integer not less than M/2, $$0 \leq c_1, c_2, \ldots, c_{\lceil \frac{M}{2} \rceil} \leq N,$$

and M, N are positive integers, M is a quantity of the plurality of synchronization sequences.

23. The apparatus of claim 22, wherein the RCP codeword is expressed as $(\tilde{c}_1,\tilde{c}_2,\ldots,\tilde{c}_M)$ with $\tilde{c}_{2k-1}=\tilde{c}_{2k}=c_k$, k =1,2, . . . , M/2, where M is an even number.

24. The apparatus of claim 23, wherein M=4, the RCP codeword is expressed as $(\tilde{c}_1,\tilde{c}_2,\ldots,\tilde{c}_M)=(c_1,c_1,c_2,c_2)$, and a plurality of cyclic shifts being derivable from the RCP codeword is expressed as: $(c_2,c_1,c_1,c_2)$, $(c_2,c_2,c_1,c_1)$, $(c_1,c_2,c_2,c_1)$ and $(c_1,c_1,c_2,c_2)$.

25. The apparatus of claim 22, wherein the RCP codeword is expressed as $(\tilde{c}_1,\tilde{c}_2,\ldots,\tilde{c}_M)$ with $$\tilde{c}_{2k-1} = \tilde{c}_{2k} = \tilde{c}_k,$$
$$k = 1, 2, \ldots, \left\lceil \frac{M}{2} \right\rceil - 1,$$
$$\tilde{c}_M = c_{\lceil \frac{M}{2} \rceil}$$

where M is an odd number.

26. The apparatus of claim 22, wherein M=4, and the set of CP codewords is expressed as $(c_1,c_2)$.

27. An apparatus comprising:
a processor; and
a memory storing a program to be executed in the processor, the program comprising instructions to:
determine a cyclically permutable (CP) codeword based on a set of CP codewords in accordance with a Cell ID; and
encode the CP codeword into a synchronization signal to be sent to a user equipment (UE), the encoding being facilitated by deriving a repetitive cyclically permutable (RCP) codeword from the CP codeword and encoding the RCP codeword into the synchronization signal, wherein the RCP codeword has a plurality of codeword elements, wherein each codeword element of the plurality of codeword elements is associated with a value, wherein the value of at least one codeword element in the RCP codeword is repeated in another codeword element position in the RCP codeword, wherein the synchronization signal comprises a plurality of synchronization sequences transmitted in a radio frame, and wherein allocation of the plurality of synchronization sequences to a plurality of slots of the radio frame is performed in accordance with the RCP codeword.

* * * * *

UNITED STATES PATENT AND TRADEMARK OFFICE
CERTIFICATE OF CORRECTION

PATENT NO. : 9,894,625 B2
APPLICATION NO. : 14/576797
DATED : February 13, 2018
INVENTOR(S) : Berggren It is certified that error appears in the above-identified patent and that said Letters Patent is hereby corrected as shown below:

In the Claims

In Column 18, Line 11, Claim 1, delete "selected".

In Column 21, Lines 5-10, Claim 19, delete the equation and insert the following equation:

$$\tilde{c}_{2k-1} = \tilde{c}_{2k} = c_k, \qquad k = 1, 2, \ldots, \left\lceil \frac{M}{2} \right\rceil - 1,$$

$$\tilde{c}_M = c_{\left\lceil \frac{M}{2} \right\rceil}$$

--.

In Column 22, Lines 18-24, Claim 25, delete the equation and insert the following equation:

$$\tilde{c}_{2k-1} = \tilde{c}_{2k} = c_k, \qquad k = 1, 2, \ldots, \left\lceil \frac{M}{2} \right\rceil - 1,$$

$$\tilde{c}_M = c_{\left\lceil \frac{M}{2} \right\rceil}$$

--.

Signed and Sealed this
Thirty-first Day of July, 2018

Andrei Iancu
*Director of the United States Patent and Trademark Office*